United States Patent [19]

Yoshida et al.

[11] Patent Number: 4,768,463
[45] Date of Patent: Sep. 6, 1988

[54] BOAT FOR LIQUID PHASE EPITAXIAL GROWTH

[75] Inventors: Susumu Yoshida; Takao Oda; Katsumi Sato, all of Itami, Japan

[73] Assignee: Mitsubishi Denki Kabushiki Kaisha, Tokyo, Japan

[21] Appl. No.: 904,706

[22] Filed: Sep. 8, 1986

[30] Foreign Application Priority Data

Oct. 4, 1985 [JP] Japan ................................ 60-222098

[51] Int. Cl.$^4$ ......................................... H01L 21/208
[52] U.S. Cl. .................................... 118/610; 118/421; 118/429
[58] Field of Search ............... 118/421, 415, 412, 610, 118/429; 156/621, 622, 624

[56] References Cited

U.S. PATENT DOCUMENTS 3,981,764  9/1976  Ito et al. ........................ 118/415 X
4,574,730  3/1986  Svilans .......................... 118/415 X
4,602,592  7/1986  Ganev ........................... 118/415 X

OTHER PUBLICATIONS

"Liquid Phase Epitaxy Technology of Large area AlGaAs/GaAs Wafers of GaAs Solar Cells for Space Application", Yoshida et al., The 17th IEEE Photovoltaic Specialists Conference Proceedings, pp. 42-45, May 1-4, 1984.

Primary Examiner—John P. McIntosh
Attorney, Agent, or Firm—Lowe, Price, LeBlanc, Becker & Shur

[57] ABSTRACT

A solution for crystal growth reserved in an upper chamber is taken from an opening formed in a slider mounted between the upper chamber and a middle chamber, and flown to the middle chamber containing a substrate, solid bodies in the solution being removed by two grids attached to a hole provided on the side of the middle chamber.

2 Claims, 4 Drawing Sheets

BOAT FOR LIQUID PHASE EPITAXIAL GROWTH

BACKGROUND OF THE INVENTION

1. Field of the Invention

The present invention relates to a boat for liquid phase epitaxial growth, and more particularly to an improvement for a boat for liquid phase epitaxial growth used in manufacturing a III - V group compound semiconductor.

2. Description of the Prior Art

The mass-production technique employing the liquid phase epitaxial technique is important in a semiconductor device using a III - V group compound semiconductor. The mass-production technique is particularly important in the field of GaAs solar battery with large sized device. A boat for liquid phase epitaxial growth used for manufacturing the GaAs solar battery by the liquid phase epitaxial method is disclosed in "Liquid Phase Epitaxy Technology of Large Area AlGaAs/GaAs Wafers of GaAs Solar Cells for Space Application", Yoshida et. al. The 17th IEEE Photovoltaic Specialists Conference Proceedings pp. 42–45, in which the authors propose a boat structure separated into three chambers, the epitaxial growth being carried out by transferring the crystal solution from an upper stage to a middle stage and then to a lower stage by means of sliders.

FIG. 1 is a cross sectional view of a conventional boat for liquid phase epitaxial growth used for manufacturing a GaAs solar battery or the like which requires mass-productivity.

In FIG. 1, a boat 1 for liquid phase epitaxial growth is of a 3-stage structure comprising an upper chamber 2, a middle chamber 3 and a bottom chamber 4. The upper chamber 2 is to reserve a solution 8 used for the liquid phase epitaxial growth. The middle chamber 3 is to contain a substrate 9 on which the liquid phase epitaxial growth is to be performed. The bottom chamber 4 is to contain solution used for the liquid phase epitaxial growth, in which a drawer 5 is inserted. A slider 6 is interposed between the upper chamber 2 and the middle chamber 3 while a slider 7 is interposed between the middle chamber 3 and the bottom chamber 4. An opening 10 is provided in the slider 6 for introducing the solution 8 from the upper chamber 2 to the middle chamber 3. An opening 11 is provided in the slider 7 for introducing the solution 8 from the middle chamber 3 to the bottom chamber 4. In addition, a L shaped plate 12 is provided at the end of the slider 6, which moves the slider 7 in the direction of an arrow A in FIG. 1 with a predetermined delay from the time when the slider 6 is moved to the direction of the arrow A.

The operation of the conventional boat for liquid phase epitaxial growth shown in FIG. 1 will be described.

First, the boat 1 in the state of FIG. 1 is inserted into a furnace (not shown) and heated to the temperature for growth. When the temperature in the furnace reached a predetermined degree, the slider 6 is moved to the direction of the arrow A in FIG. 1, the solution 8 reserved in the upper chamber 2 is introduced to the middle chamber 3 through the opening 10 provided in the slider 6 and the substrate 9 is dipped in the solution 8. When the boat is gradually cooled as it is, an epitaxial layer grows on the surface of the substrate 9.

After the completion of the liquid phase epitaxial growth, the slider 6 is further moved to the direction of the arrow A to interlock the slider 7 by the L shaped plate 12 so that the opening 11 provided in the slider 7 is positioned below the middle chamber 3. Thus, the solution 8 flows from the middle chamber 3 into the bottom chamber 4 to be contained in the drawer 5.

Since the conventional boat for liquid phase epitaxial growth is structured as described above and the material of the boat is carbon, carbon powder is generated due to the sliding of the slider to contaminate the solution. In addition, solid oxide is included in the solution. In case where the solution including these carbon powder and oxide is employed, there arises a problem that the surface of the substrate becomes uneven causing degradation of the surface of the substrate finished with the liquid phase epitaxial growth.

SUMMARY OF THE INVENTION

A principal object of the present invention is to provide a boat for liquid phase epitaxial growth which provides a good substrate surface in liquid phase epitaxial growth.

Briefly stated, according to the present invention, a solution used for crystal growth reserved in a first chamber is taken from an opening provided in a sliding plate separating the first chamber from the second chamber and, it flows into a second chamber containing a substrate on which the crystal is to be grown through a plurality of solid body removing means provided in a path to the second chamber.

According to the present invention, a plurality of solid body removing means remove solid bodies from the solution taken from the first chamber, so that a good surface of liquid phase epitaxial growth can be obtained.

These objects and other objects, features, aspects and advantages of the present invention will become more apparent from the following description of the present invention when taken in conjunction with the accompanying drawings.

DESCRIPTION OF THE PREFERRED EMBODIMENTS

Figure 1:
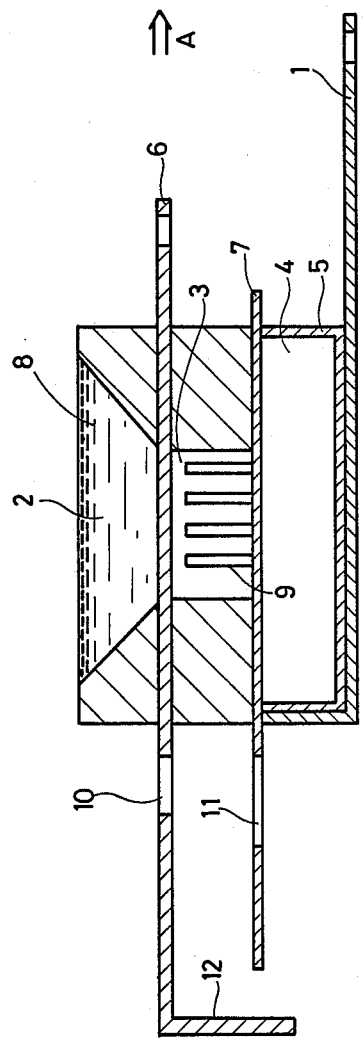
FIG. 1 is a cross sectional view of a conventional boat for liquid phase epitaxial growth.
Figure 2:
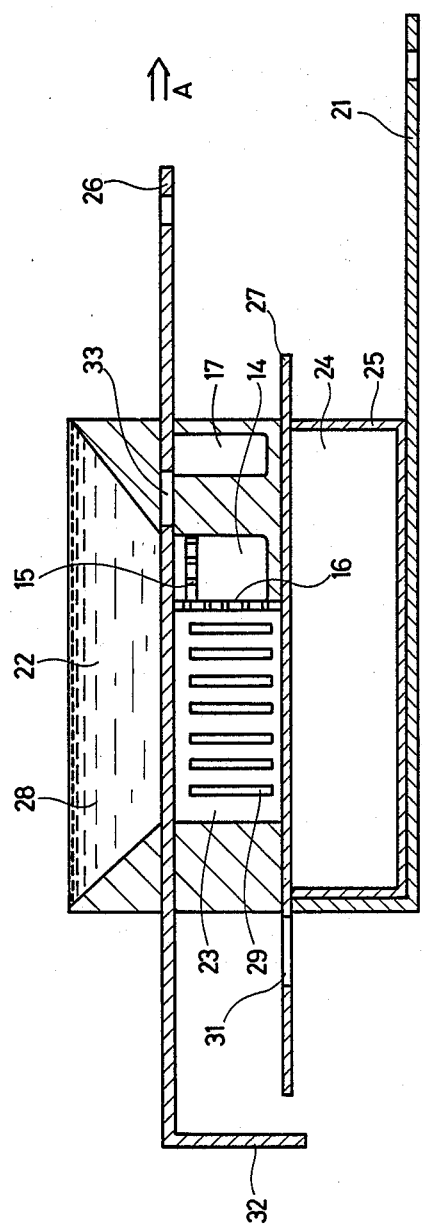
FIG. 2 is a cross sectional view of a boat for liquid phase epitaxial growth according to one embodiment of the present invention.

FIG. 2 is a cross section of a boat for liquid phase epitaxial growth according to one embodiment of the present invention. In FIG. 2, the boat 21 for liquid phase epitaxial growth of the present invention is of a 3-stage structure comprising an upper chamber 22, middle chamber 23 and a bottom chamber 24. The upper chamber 22 is to reserve a solution 28 used for liquid phase epitaxial growth. The middle chamber 23 is to contain a substrate 29 on which the liquid phase epitaxial growth is to be performed. The bottom chamber 24 is to contain the solution used for liquid phase epitaxial growth, in which a drawer 25 is inserted. A slider 26 is interposed between the upper chamber 22 and the middle chamber 23 while a slider 27 is interposed between the middle chamber 23 and the bottom chamber 24. An opening 33 is provided in the slider 26 for introducing the solution 28 from the upper chamber 22 into the middle chamber 23. An opening 31 is provided in the slider 27 for introducing the solution 28 from the middle chamber 23 into the bottom chamber 24. In addition, a L shaped plate 32 is attached to the end of the slider 26 for moving the slider 27 into the direction of an arrow A shown in FIG. 2 with a prescribed delay from the time when the slider 26 is moved into the direction of the arrow A.

In this embodiment, two member plates with slits, namely, grids are used as solid body removing means for purify the solution 28. One grid 16 is provided between the second chamber and a hole 14 on the side of the second chamber, while the other grid 15 is provided in the hole 14 approximately parallel to the slider 26.

Figure 3:
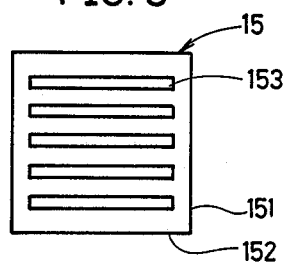
FIGS. 3 and 4 illustrate grids used for the boat for liquid phase epitaxial growth of the present invention.
Figure 4:
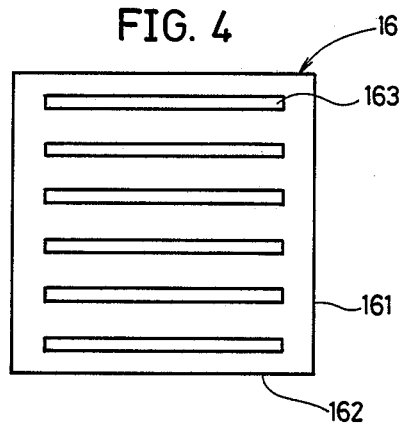

Grids 15 and 16 are shown in FIGS. 3 and 4, respectively.

In FIG. 3, two sides 151 and 152 of the grid 15 are, e.g., 10~30 mm, respectively, and the width of the slit 153 is, e.g., 1~3 mm. In FIG. 4, two sides 161 and 162 of the grid 16 are, e.g., 40~50 mm, respectively, and the width of the slit 163 is, e.g., 1~3 mm. The reason why two plates having slits are provided in the present embodiment is to have a clear solution contact with the substrate and that only one plate is not satisfactory. Therefore, more than two plates having slits may be provided according to the degree of contamination (susceptibility to oxidation, degree of oxidation) of the solution.

In FIG. 2, a hole 17 is provided at the middle stage of the boat for liquid phase epitaxial growth for containing the solution stays in the opening 33 of the slider 26.

Now, the method for performing liquid phase epitaxial growth using the boat for liquid phase epitaxial growth according to the present embodiment will be described with reference to the liquid phase epitaxial growth of a GaAs solar battery.

Sliders 26 and 27 are slid to the prescribed position shown in FIG. 2, and a GaAs substrate 29 is placed in the middle chamber 23. The solution 28 (saturated Ga solution) composed of Ga, GaAs, Al and Zn is reserved in the upper chamber 22, and then the boat 21 is inserted into a prescribed position (not shown) in the furnace and heated to a prescribed growth temperature. When the temperature in the furnace reaches equilibrium at a prescribed temperature, the slider 26 is slid in the opposite direction of the arrow A to position the opening 33 above the hole 14. Then the saturated Ga solution 28 reserved in the upper chamber 22 flows from the opening 33 through the hole 14, and into the middle chamber 23 from the side of the middle chamber 23 in which the GaAs substrate 29 is placed.

Since sufficient amount of the saturated Ga solution 28 is reserved in the upper chamber 22, all GaAs substrates 29 are dipped in the saturated Ga solution 28. On this occasion, the saturated Ga solution 28 is filtered as it passes through the grids 15 and 16, so that the solid bodies such as carbon or oxide in the saturated Ga solution 28 are left in the upper chamber 22 and the hole 14.

Subsequently, in order to carry out the epitaxial growth, the temperature of the growth furnace is lowered and the boat 21 is gradually cooled. When the boat 21 is cooled to a prescribed temperature and desired thickness of the epitaxial growth layer is obtained, the slider 26 is slid into the direction of the arrow A in FIG. 2. Then the slider 27 is interlocked by the L shaped plate 32. Thus, the solution 28 flows from the middle chamber 23 to the bottom chamber 24 through the opening 31 provided in the slider 27. The solution flown into the bottom chamber 24 is contained in the drawer 25. By using the boat for liquid phase epitaxial growth of this embodiment structured as above, since the saturated Ga solution 28 flows from the upper chamber 22 to the middle chamber 23 containing the substraight through the grids 15 and 16, the solid bodies in the saturated Ga solution are removed and only clear solution contacts the substrate, resulting in a mirrored-surface and lustrous epitaxial growth layer.

Figure 5:
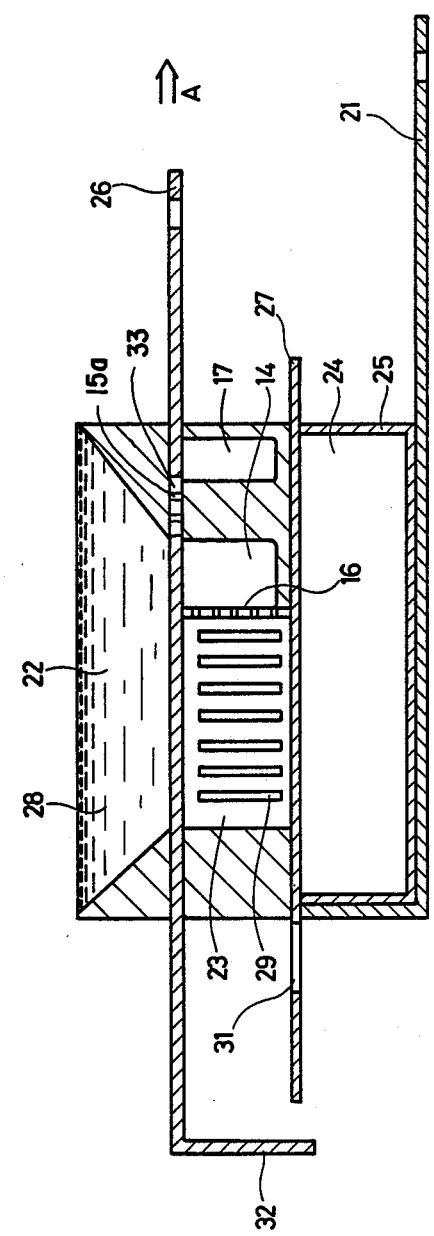
FIG. 5 is a cross sectional view of a boat for liquid phase epitaxial growth accrording to an alternate embodiment of the present invention.

Although the liquid phase epitaxial growth of AlGaAs is described in the above embodiment, epitaxial growth layers of GaAs, GaP, InP or InAs or the like can be obtained with mirrored-surface and lustrous state by changing the material of the solution and the substrate. In addition, although one of the two grids is provided in parallel to the slider 26 in the above embodiment, the grid 15 may be replaced by the opening 33 with slits 15a in the slider 26 to obtain the same effect as shown in FIG. 5.

Although two grids are placed perpendicular to each other in this embodiment, these may be placed parallel to each other, and any arrangement may be applied provided that the solution passes one slit and then the other slit. In this case, the width of the slit of a grid through which the solution passes first must be the same or larger than the width of the slit of another grid through which the solution passes later.

Although two grids are provided in the above described embodiment, more than two grids may be provided according to the degree of contamination of the solution.

Although the present invention has been described and illustrated in detail, it is clearly understood that the same is by way of illustration and example only and is not be taken by way of limitation, the spirit and scope of the present invention being limited only by the terms of the appended claims.

What is claimed is:

1. A boat for a liquid phase epitaxial growth comprising;
    a first chamber for reserving a solution used for crystal growth,
    a second chamber provided adjacently below said first chamber for containing a substrate on which liquid phase epitaxial growth is to be performed,
    a slidable sliding plate for separating said first chamber from said second chamber, having an opening for introducing said solution from said first chamber, and
    a plurality of solid body removing means provided in a path from said first chamber through said opening to said second chamber for removing a solid body from said solution,
    said plurality of solid body removing means comprising first and second plate members,
    said first and second plate members being provided with a plurality of slits for preventing solid bodies included in said solution from passing and for allowing clear solution only to pass, said first plate member being provided approximately perpendicular to said sliding plate in relation with said second chamber, and
    said second plate member being provided approximately parallel to said sliding plate.

2. A boat for liquid phase epitaxial growth comprising;

a first chamber for reserving a solution used for crystal growth, a second chamber provided adjacently below said first chamber for containing a substrate on which liquid phase epitaxial growth is to be performed, a slidable sliding plate for separating said first chamber from said second chamber, having an opening for introducing said solution from said first chamber, and a plurality of solid body removing means provided in a path from said first chamber through said opening to said second chamber for removing a solid body from said solution, said plurality of solid body removing means comprising a plate member provided approximately perpendicular to said sliding plate in relation to said second chamber and in which a plurality of slits are formed, and a plurality of slits formed in said opening of said sliding plate.

* * * * *